(12) United States Patent
Murakami

(10) Patent No.: US 11,011,342 B2
(45) Date of Patent: May 18, 2021

(54) BEAM BENDER

(71) Applicant: Ebara Corporation, Tokyo (JP)

(72) Inventor: Takeshi Murakami, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.

(21) Appl. No.: 16/435,744

(22) Filed: Jun. 10, 2019

(65) Prior Publication Data

US 2019/0378677 A1 Dec. 12, 2019

(30) Foreign Application Priority Data

Jun. 11, 2018 (JP) .............................. JP2018-110915

(51) Int. Cl.

| | |
|---|---|
| *H01J 37/05* | (2006.01) |
| *H01J 37/28* | (2006.01) |
| *H01J 37/10* | (2006.01) |
| *H01J 37/147* | (2006.01) |
| *H01J 37/244* | (2006.01) |
| *G01R 31/305* | (2006.01) |

(52) U.S. Cl.
CPC ............ *H01J 37/05* (2013.01); *G01R 31/305* (2013.01); *H01J 37/10* (2013.01); *H01J 37/147* (2013.01); *H01J 37/244* (2013.01); *H01J 37/28* (2013.01); *H01J 2237/0635* (2013.01); *H01J 2237/1508* (2013.01); *H01J 2237/28* (2013.01)

(58) Field of Classification Search
CPC .. H01J 37/00; H01J 37/02; H01J 37/05; H01J 37/10; H01J 37/12; H01J 37/14; H01J 37/141; H01J 37/143; H01J 37/145; H01J 37/147
USPC .............................. 250/305, 396 R, 396 ML
See application file for complete search history.

(56) References Cited

U.S. PATENT DOCUMENTS

| | | | | |
|---|---|---|---|---|
| 4,823,003 | A * | 4/1989 | King ......................... | H01J 3/12 250/305 |
| 2004/0188607 | A1 * | 9/2004 | Ose ......................... | H01J 37/05 250/305 |
| 2010/0320382 | A1 | 12/2010 | Almogy et al. | |

FOREIGN PATENT DOCUMENTS

JP          2010-519697 A      6/2010

* cited by examiner

*Primary Examiner* — Jason L McCormack
(74) *Attorney, Agent, or Firm* — Abelman, Frayne & Schwab

(57) ABSTRACT

In a first cross section along an electron ray that passes between an inner curved surface and an outer curved surface of a beam bender, the curvature of the surfaces are fixed, and the center of the curvature of the surfaces are set so as to match each other. In a second cross section perpendicular to the electron ray, the curvature of the surfaces are fixed, and the center of curvature of the surfaces are set so as to match each other. The radius of the curvature of the surface in the second cross section is set to be larger than that of the surface in the first cross section. The radius of curvature of the surface in the second cross section is set to be larger than that of the surface in the first cross section.

4 Claims, 6 Drawing Sheets

BEAM BENDER

CROSS-REFERENCE TO RELATED APPLICATIONS

This application is based on and claims priority from Japanese Patent Application No. 2018-110915, filed on Jun. 11, 2018, with the Japan Patent Office, the disclosure of which is incorporated herein in its entirety by reference.

TECHNICAL FIELD

The present invention relates to a beam bender for bending the trajectory of an electron ray.

BACKGROUND

Hitherto, a beam bender for bending an electron ray has been used in an electron microscope and the like. For example, a beam bender that bends the trajectories of a plurality of electron rays (multi-beam) in a multi-beam scanning electron microscope is proposed (for example, see JP2010-519697). In an electron beam apparatus such as an electron microscope, a primary optical system (an optical system for irradiating a sample W with an electron ray emitted from an electron gun) and a secondary optical system (an optical system for guiding a secondary electron released from the sample W to a detector) need to be arranged in a limited space in a casing.

For example, in a multi-beam SEM, there are many cases where the trajectory of a primary electron and the trajectory of the secondary electron substantially overlap each other near the sample, and a beam bender using a Wien filter or a magnetic field is used in many cases in order to separate those trajectories from each other. However, those optical elements cause larger aberration and dispersion as the bending angle of the trajectory increases. Therefore, the bending angle of a primary electron beam of which resolution is considered to be important is particularly desired to be minimized in a scanning microscope. However, when the trajectory of the electron ray of the primary optical system and the trajectory of the secondary electron of the secondary optical system are close to each other, there may be cases where devices forming the primary optical system and devices forming the secondary optical system interfere with each other and it becomes difficult or impossible to arrange the devices forming the primary optical system and the devices forming the secondary optical system in the limited space in the casing. In those cases, the primary optical system and the secondary optical system can be arranged in the casing by mainly bending the trajectory of the secondary electron of the secondary optical system by a large degree with use of the beam bender. For example, the beam bender is used in the electron microscope and the like as above.

However, the beam bender of the related art has a problem in that the convergence property of the electron ray bent by the beam bender is not high. More specifically, there has been a problem in that the misalignment between the positions at which parallelly entering electron rays separated from the central trajectory of the electron ray by a predetermined distance intersect with the central trajectory after passing through the beam bender is large.

SUMMARY

The present invention has been made in view of the abovementioned problem, and an object thereof is to provide a beam bender capable of improving a convergence property of an electron ray bent by a beam bender.

A beam bender according to an embodiment of the present invention is a beam bender including: an inner electrode having an inner curved surface; and an outer electrode having an outer curved surface, the beam bender being for bending an electron ray that passes between the inner curved surface and the outer curved surface by an electric field that is generated when different electrical potentials are applied to the inner electrode and the outer electrode. In the beam bender, a curvature of the inner curved surface and a curvature of the outer curved surface are fixed, and a center of curvature of the inner curved surface and a center of curvature of the outer curved surface are set so as to match each other in a first cross section along a direction of travel of the electron ray that passes between the inner curved surface and the outer curved surface, a curvature of the inner curved surface and a curvature of the outer curved surface are fixed, and a center of curvature of the inner curved surface and a center of curvature of the outer curved surface are set so as to match each other in a second cross section perpendicular to the direction of travel of the electron ray, a radius of curvature of the inner curved surface in the second cross section is set to be larger than a radius of curvature of the inner curved surface in the first cross section, and a radius of curvature of the outer curved surface in the second cross section is set to be larger than a radius of curvature of the outer curved surface in the first cross section.

The present invention is not limited to the above modes, and can be implemented as various modes such as a method for controlling an electromagnet, a program for controlling an electromagnet, a storage medium which records the program in a manner that the program is readable by a computer, and so on.

DETAILED DESCRIPTION

Figure 1:
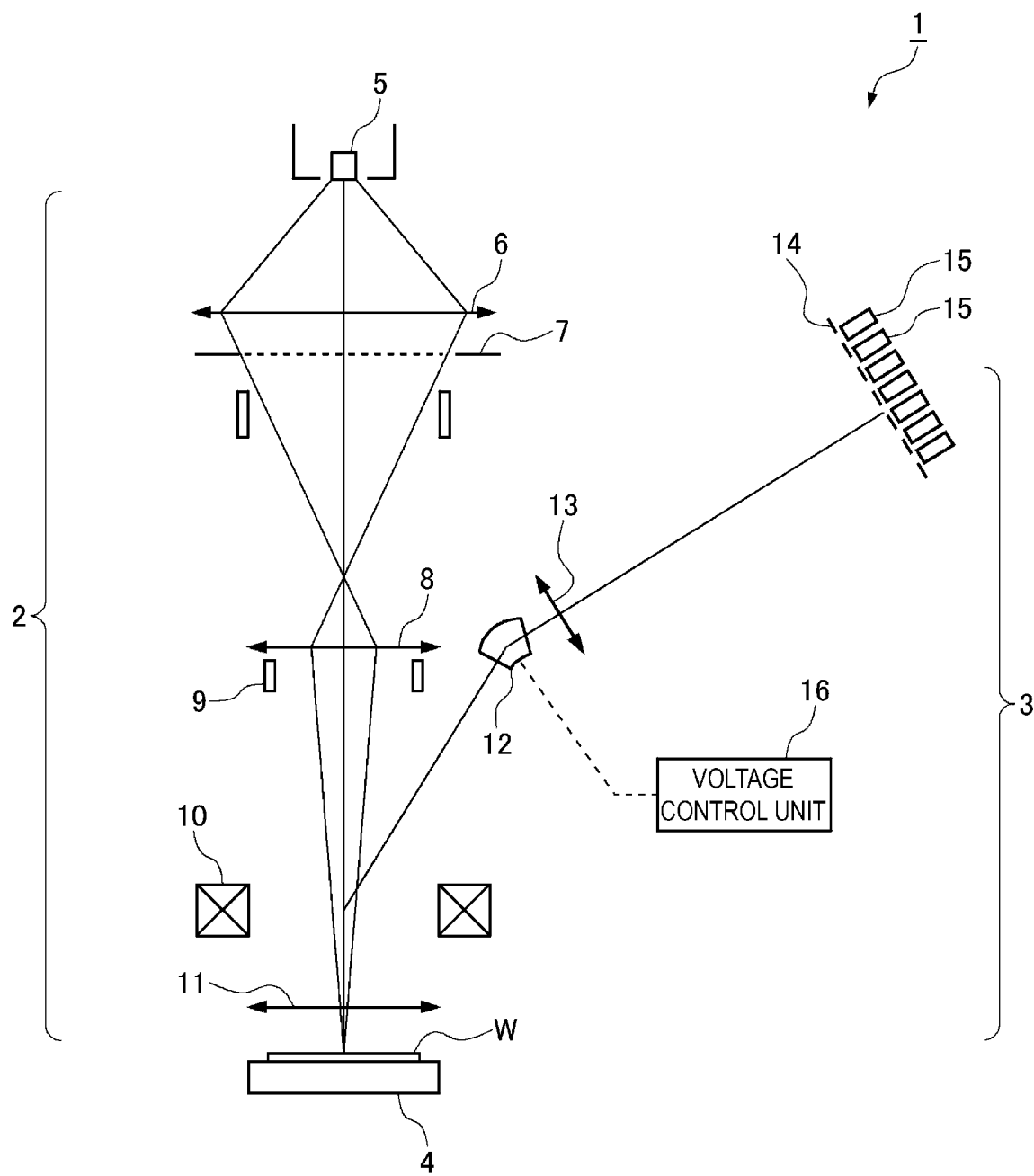
FIG. 1 is an explanatory diagram of an electron beam apparatus (multi-beam scanning electron microscope) to which a beam bender of an embodiment of the present invention is applied.

A beam bender of an embodiment is described below. Note that the embodiment described below is an example for when the present technology is performed, and the present technology is not limited to the specific configurations described below. When the present technology is performed, specific configurations according to the embodiment may be employed, as appropriate.

A beam bender according to an embodiment of the present invention is a beam bender including: an inner electrode having an inner curved surface; and an outer electrode having an outer curved surface, the beam bender being for bending an electron ray that passes between the inner curved surface and the outer curved surface by an electric field that is generated when different electrical potentials are applied to the inner electrode and the outer electrode. In the beam bender, a curvature of the inner curved surface and a curvature of the outer curved surface are fixed, and a center of curvature of the inner curved surface and a center of curvature of the outer curved surface are set so as to match each other in a first cross section along a direction of travel of the electron ray that passes between the inner curved surface and the outer curved surface, a curvature of the inner curved surface and a curvature of the outer curved surface are fixed, and a center of curvature of the inner curved surface and a center of curvature of the outer curved surface are set so as to match each other in a second cross section perpendicular to the direction of travel of the electron ray, a radius of curvature of the inner curved surface in the second cross section is set to be larger than a radius of curvature of the inner curved surface in the first cross section, and a radius of curvature of the outer curved surface in the second cross section is set to be larger than a radius of curvature of the outer curved surface in the first cross section.

According to the configuration above, the convergence property of the electron ray bent by the beam bender can be improved. More specifically, the misalignment between the positions at which the parallelly entering electron rays separated from the central trajectory of the electron ray entering the place between the inner curved surface and the outer curved surface by a predetermined distance intersect with the central trajectory after passing between the inner curved surface and the outer curved surface can be reduced.

In addition, in the beam bender according to an embodiment of the present invention, in the second cross section, a normal line of the inner curved surface passing through a center position of the inner curved surface and a normal line of the outer curved surface passing through a center position of the outer curved surface may match each other, a position through which the electron ray passes may be set on the normal lines, a curved surface shape of the inner curved surface may have a symmetrical shape about the normal lines, and a curved surface shape of the outer curved surface may have a symmetrical shape about the normal lines.

According to the configuration above, the inner curved surface and the outer curved surface have a symmetrical shape, and hence the symmetry of the electron ray bent by the beam bender can be improved.

In addition, in the beam bender according to an embodiment of the present invention, the radius of curvature of the inner curved surface and the radius of curvature of the outer curved surface in the second cross section may be set so that a misalignment between positions at which parallelly entering electron rays separated from a central trajectory of the electron rays that pass through the middle point between the inner curved surface and the outer curved surface by a predetermined distance intersect with the central trajectory after passing between the inner curved surface and the outer curved surface in the first cross section is small.

According to the configuration above, the convergence property of the electron ray bent by the beam bender can be improved by setting the radius of curvature of the inner curved surface and the radius of curvature of the outer curved surface in the second cross section, as appropriate.

In addition, in the beam bender according to an embodiment of the present invention, the radius of curvature of the inner curved surface in the second cross section may be set to be more than once as large as the radius of curvature of the inner curved surface in the first cross section and three times as large or less as the radius of curvature of the inner curved surface in the first cross section, and the radius of curvature of the outer curved surface in the second cross section may be set to be more than once as large as the radius of curvature of the outer curved surface in the first cross section and three times as large or less as the radius of curvature of the outer curved surface in the first cross section.

According to the configuration above, the convergence property of the electron ray bent by the beam bender can be improved by setting the radius of curvature of the inner curved surface and the radius of curvature of the outer curved surface in the second cross section, as appropriate.

According to the present invention, the convergence property of the electron ray bent by the beam bender can be improved. In addition, the spectral characteristic of the electron ray can be expected to be improved by using the beam bender of the present invention as a spectrometer.

The beam bender of the embodiment of the present invention is described below with reference to the drawings. In this embodiment, the case for a beam bender used in an electron beam apparatus such as a multi-beam scanning electron microscope is exemplified.

FIG. 1 is an explanatory diagram illustrating the configuration of the electron beam apparatus (multi-beam scanning electron microscope) to which the beam bender of this embodiment is applied. As illustrated in FIG. 1, an electron beam apparatus 1 includes a primary optical system 2 for irradiating a sample W with electron rays, and a secondary optical system 3 for detecting secondary electrons released from the sample W. The sample W is a semiconductor wafer, for example, and is placed on a stage 4.

The primary optical system 2 includes an electron gun 5 that releases the electrons, a condenser lens 6 that converges the electron ray (electron beam) released from the electron gun 5, and a multi-aperture plate 7 arranged on the downstream of the condenser lens 6. The multi-aperture plate 7 has a plurality of apertures and has a function of generating a plurality of electron beams (multi-beam) from the electron ray. In addition, the primary optical system 2 includes a condenser lens 8 that decreases the electron beam in size, a deflector 9 that performs scanning with the electron beam, a Wien filter 10 (E×B), and an objective lens 11.

The secondary optical system 3 includes a beam bender 12 that bends the secondary electron separated from the primary optical system 2 by the Wien filter 10, a projection lens 13 having one or more stages arranged on the downstream of the beam bender 12, a multi-aperture detection plate 14 having a plurality of apertures corresponding to the plurality of apertures in the multi-aperture plate 7, and a plurality of detectors 15 arranged near the positions corresponding to the plurality of apertures in the multi-aperture detection plate 14. The beam bender 12 includes a voltage control unit 16 for performing voltage adjustment (described below).

Figure 2:
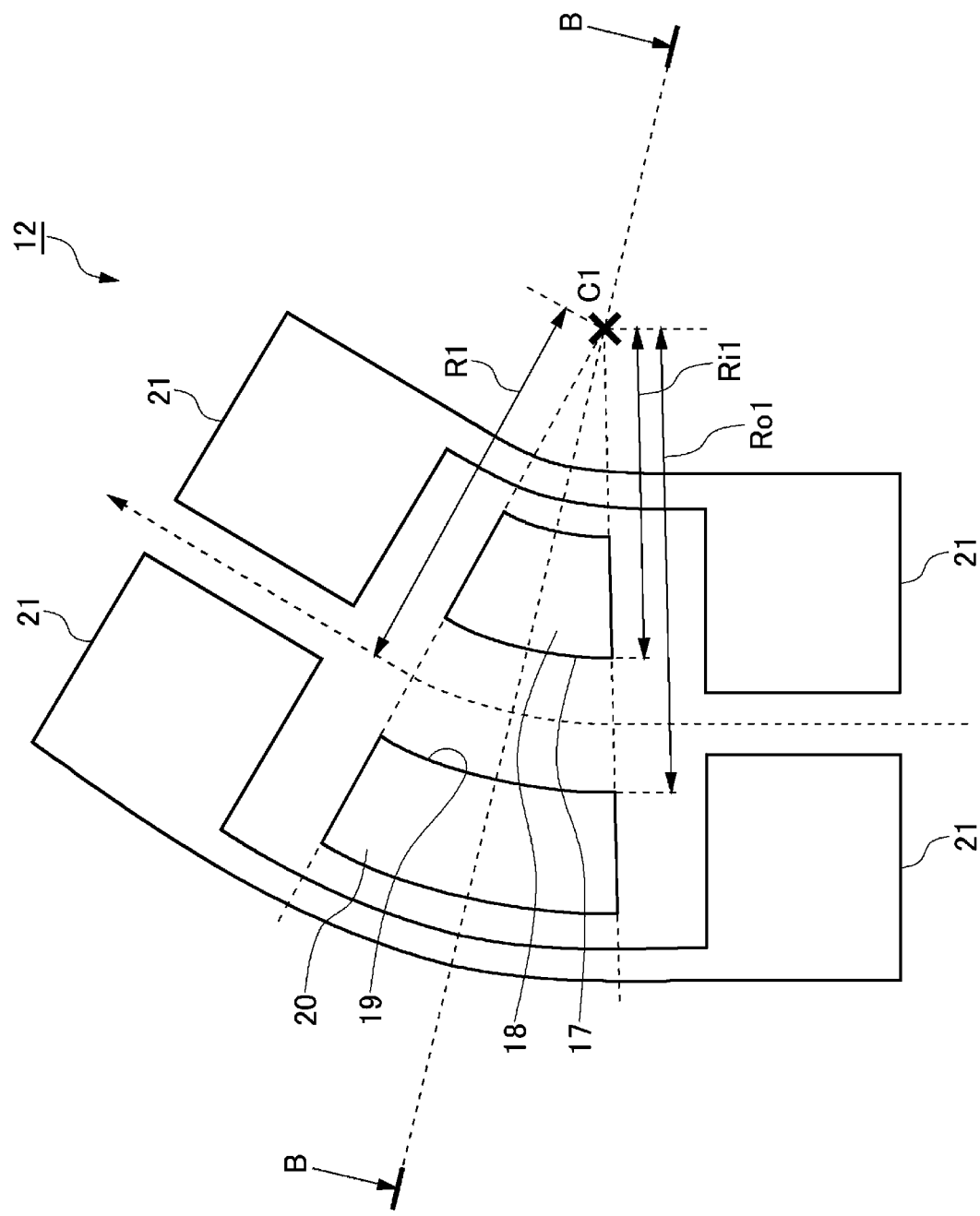
FIG. 2 is a cross sectional view (a cross sectional view taken along line A-A in FIG. 3) of the beam bender of the embodiment of the present invention.
Figure 3:
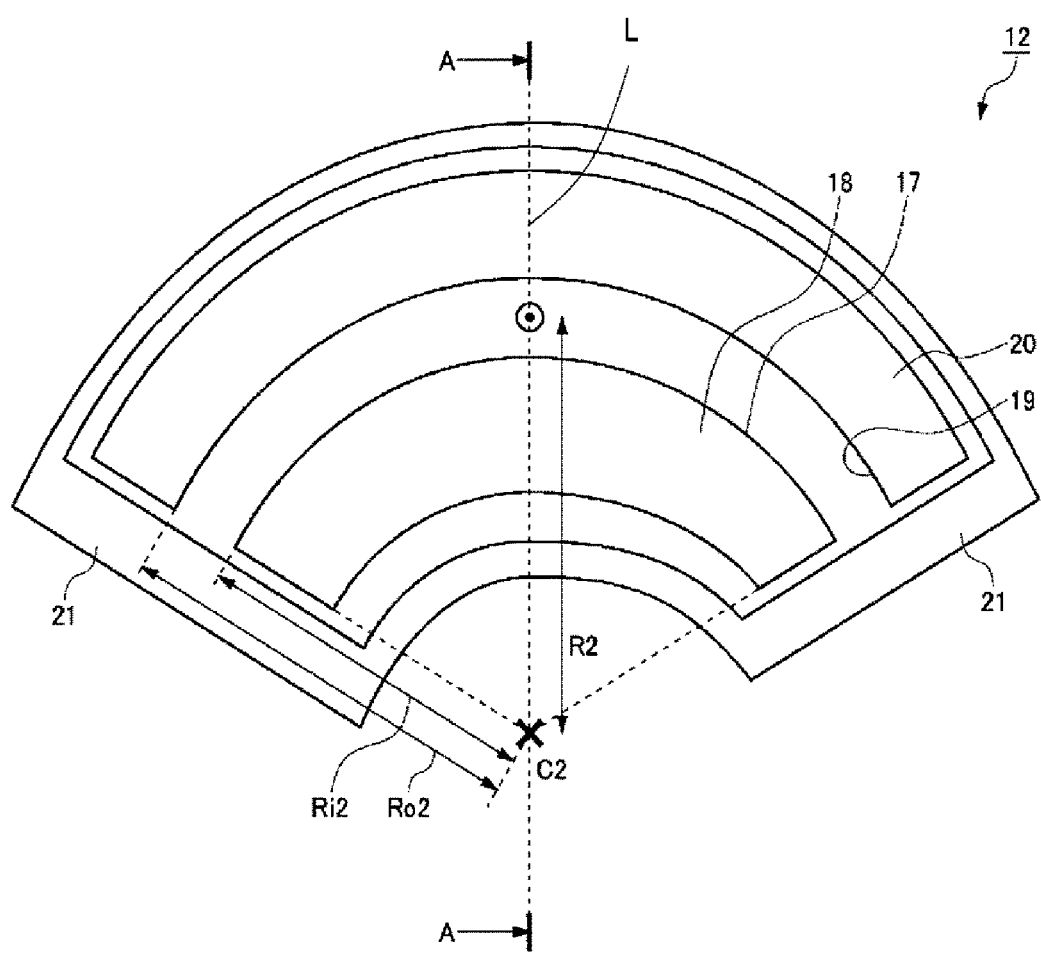
FIG. 3 is a cross sectional view (a cross sectional view taken along line B-B in FIG. 2) of the beam bender of the embodiment of the present invention.

FIG. 2 and FIG. 3 are cross sectional views for describing the configuration of the beam bender 12. As illustrated in FIG. 2 and FIG. 3, the beam bender 12 includes an inner electrode 18 having an inner curved surface 17, an outer electrode 20 having an outer curved surface 19, and ground electrodes 21 arranged on the outside of the inner electrode 18 and the outer electrode 20. The beam bender 12 has a function of bending the electron ray (secondary electron) that passes between the inner curved surface 17 and the outer curved surface 19 by a predetermined angle by an electric field that is generated when different electrical potentials are applied to the inner electrode 18 and the outer electrode 20 (see FIG. 4A and FIG. 4B). Note that FIG. 2 is a cross sectional view (a cross sectional view taken along line A-A in FIG. 3) of a first cross section along the direction of travel of the electron ray that passes between the inner curved surface 17 and the outer curved surface 19, and FIG. 3 is a cross sectional view (a cross sectional view taken along line B-B in FIG. 2) of a second cross section perpendicular to the direction of travel of the electron ray.

As illustrated in FIG. 2, in the first cross section (the cross section along the direction of travel of the electron ray), the curvature of the inner curved surface 17 and the curvature of the outer curved surface 19 are fixed, and the center of curvature of the inner curved surface 17 and the center of curvature of the outer curved surface 19 are set so as to match each other. In FIG. 2, the radius of curvature of the inner curved surface 17 in the first cross section is indicated as Ri1 (for example, Ri1=65 mm), the radius of curvature of the outer curved surface 19 in the first cross section is indicated as Ro1 (for example, Ro1=75 mm), the radius of curvature of the central trajectory of the electron ray that passes the middle point between the inner curved surface 17 and the outer curved surface 19 in the first cross section is indicated as R1 (for example, R1=70 mm), and the center of curvature of the inner curved surface 17 and the center of curvature of the outer curved surface 19 in the first cross section are indicated as C1.

In addition, as illustrated in FIG. 3, in the second cross section (the cross section perpendicular to the direction of travel of the electron ray), the curvature of the inner curved surface 17 and the curvature of the outer curved surface 19 are fixed, and the center of curvature of the inner curved surface 17 and the center of curvature of the outer curved surface 19 are set so as to match each other. In FIG. 3, the radius of curvature of the inner curved surface 17 in the second cross section is indicated as Ri2 (for example, Ri2=75 mm, 115 mm), the radius of curvature of the outer curved surface 19 in the second cross section is indicated as Ro2 (for example, Ro2=85 mm, 125 mm), the radius of curvature of the central trajectory of the electron ray that passes between the inner curved surface 17 and the outer curved surface 19 in the second cross section is indicated as R2 (for example, R2=80 mm, 120 mm), and the center of curvature of the inner curved surface 17 and the center of curvature of the outer curved surface 19 in the second cross section are indicated as C2.

In this case, the radius of curvature (for example, Ri2=75 mm, 115 mm) of the inner curved surface 17 in the second cross section is set to be larger than the radius of curvature (for example, Ri1=65 mm) of the inner curved surface 17 in the first cross section. In addition, the radius of curvature (for example, Ro2=85 mm, 125 mm) of the outer curved surface 19 in the second cross section is set to be larger than the radius of curvature (for example, Ro1=75 mm) of the outer curved surface 19 in the first cross section. In addition, the radius of curvature (for example, R2=80 mm, 120 mm) of the central trajectory in the second cross section is set to be larger than the radius of curvature (for example, R1=70 mm) of the central trajectory in the first cross section.

In addition, as illustrated in FIG. 3, in the second cross section (the cross section perpendicular to the direction of travel of the electron ray), a normal line L of the inner curved surface 17 passing through the center position of the inner curved surface 17 and a normal line L of the outer curved surface 19 passing through the center position of the outer curved surface 19 match each other, and the position through which the electron ray passes is set on the normal line L. Further, the curved surface shape of the inner curved surface 17 has a symmetrical shape (a bilaterally symmetrical shape in FIG. 3) about the normal line L, and the curved surface shape of the outer curved surface 19 has a symmetrical shape (a bilaterally symmetrical shape in FIG. 3) about the normal line.

Figure 4A:
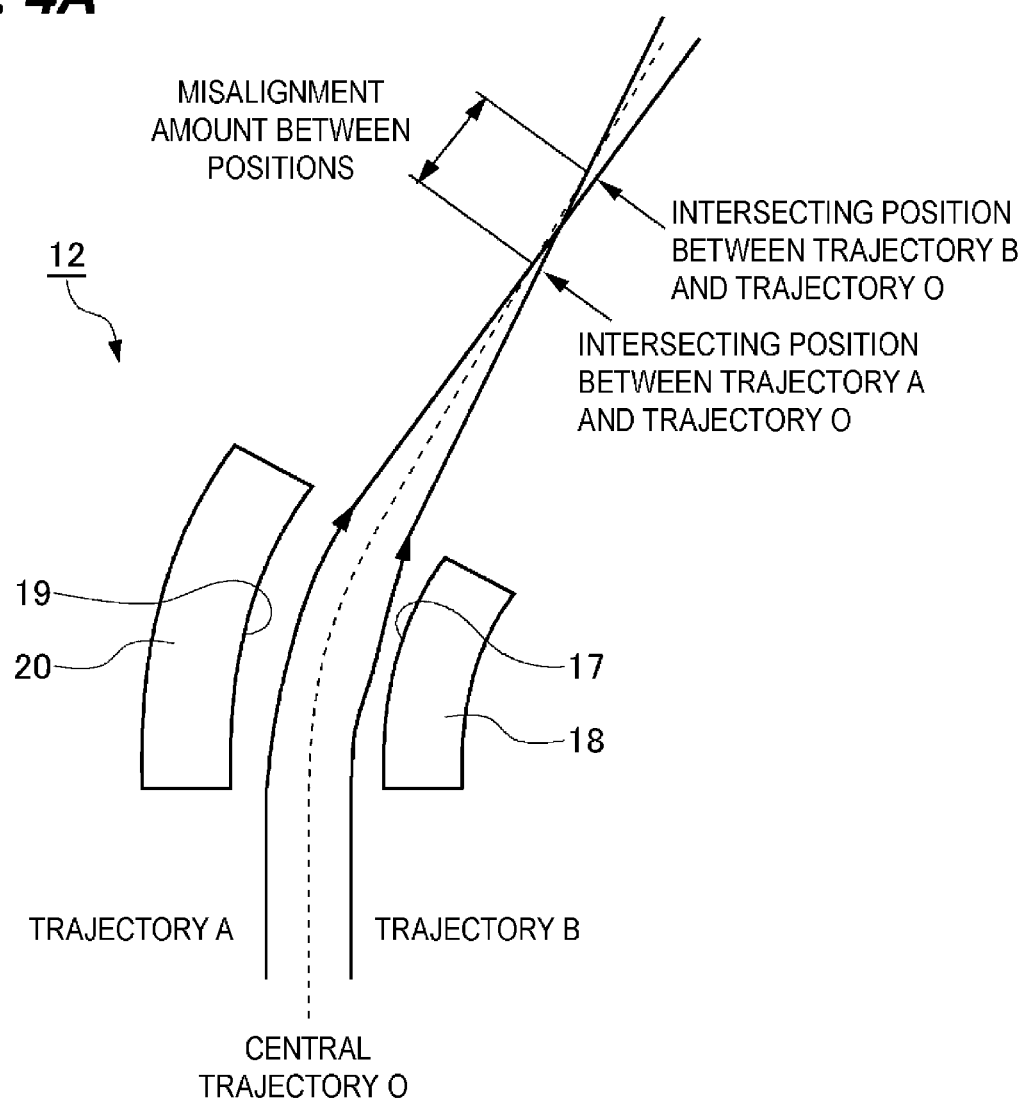
FIG. 4A and FIG. 4B are explanatory diagrams of a convergence property of an electron ray of the beam bender of the embodiment of the present invention.

In this case, as illustrated in FIG. 4A, the radius of curvature (for example, Ri2=75 mm, 115 mm) of the inner curved surface 17 and the radius of curvature (for example, Ro2=85 mm, 125 mm) of the outer curved surface 19 in the second cross section are set so that the misalignment between the positions at which parallelly entering electron rays separated from the central trajectory of the electron ray that passes between the inner curved surface 17 and the outer curved surface 19 by a predetermined distance intersect with the central trajectory after passing between the inner curved surface 17 and the outer curved surface 19 in the first cross section is small (the cross section along the direction of travel of the electron ray) under a bidirectional convergence condition.

In order to reduce the misalignment between the positions at which the parallelly entering electron rays separated from the central trajectory of the electron ray that passes between the inner curved surface 17 and the outer curved surface 19 by a predetermined distance intersect with the central trajectory after passing between the inner curved surface 17 and the outer curved surface 19 in the first cross section (the cross section along the direction of travel of the electron ray), the radius of curvature of the inner curved surface 17 in the second cross section is preferred to be set to be more than once as large as the radius of curvature of the inner curved surface 17 in the first cross section and three times as large or less as the radius of curvature of the inner curved surface 17 in the first cross section (1×Ri1≤Ri23×Ri1), and the radius of curvature of the outer curved surface 19 in the second cross section is preferred to be set to be more than once as large as the radius of curvature of the outer curved surface 19 in the first cross section and three times as large or less as the radius of curvature of the outer curved surface 19 in the first cross section (1×Ro1≤Ro23×Ro1).

When the central trajectory is a straight line and a rotationally symmetrical electrostatic lens or electromagnetic lens is used, the focal lengths of the parallelly entering electron rays separated from the central trajectory by a predetermined distance are not dependent on the phase. Meanwhile, when the central trajectory is a curved line as in the beam bender of the present invention, the focal lengths of the parallelly entering electron rays separated from the central trajectory by a predetermined distance are dependent on the phase with respect to the plane including the central trajectory. FIG. 4A visually describes the above. Each of the trajectories, that is, a central trajectory O of the electron ray, a trajectory A that enters a position directly above the central trajectory O in FIG. 3, and a trajectory B that enters a position directly below the central trajectory O in FIG. 3 are illustrated. After the trajectories pass through the beam bender, the trajectory A intersects with the trajectory O first, and then the trajectory B intersects with the trajectory O. The convergence property is herein discussed from the viewpoint of the difference between the maximum value and the minimum value of the positions at which the trajectories of the beams of different phases intersect with the central trajectory. The convergence property is herein referred to as a misalignment amount between the intersecting positions with respect to the central trajectory.

Figure 4B:
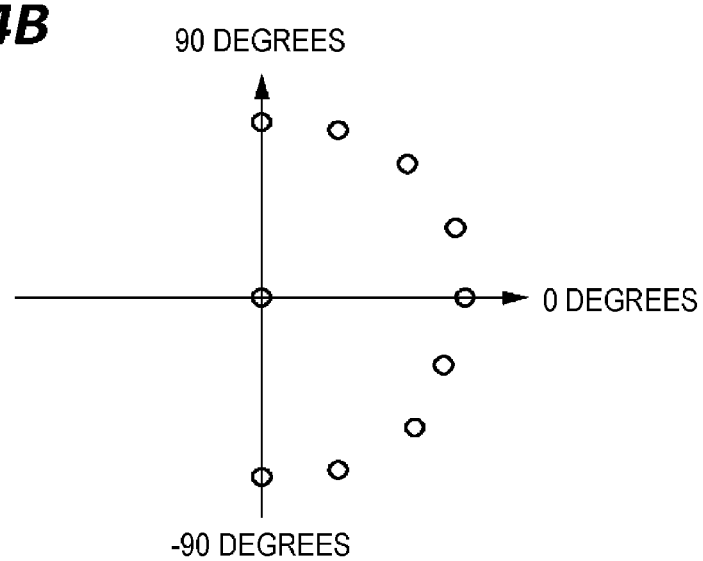

The misalignment amount between the intersecting positions with respect to the central trajectory also changes in accordance with the electrical potentials applied to the inner electrode and the outer electrode. FIG. 4B illustrates phases when the electron ray enters for evaluating the misalignment amount between the intersecting positions with respect to the central trajectory in accordance with a numerical simulation including electric field calculation and charged particle trajectory calculation. The top, bottom, left and right in FIG. 4B match with the top and the bottom and the left and the right with respect to the central trajectory of the electron ray in FIG. 3. In this case, as illustrated in FIG. 4B, the positions at which parallelly entering electron rays separated by a predetermined distance r in the phases of −90 degrees, −67.5 degrees, −45 degrees, −22.5 degrees, 0 degrees, 22.5 degrees, 45 degrees, 67.5 degrees, and 90 degrees with respect to the central trajectory O of the electron ray intersect with the central trajectory after passing between the inner curved surface 17 and the outer curved surface 19 are calculated, and the misalignment amount between the intersecting positions is calculated as the difference between the maximum value and the minimum value thereof.

Figure 5:
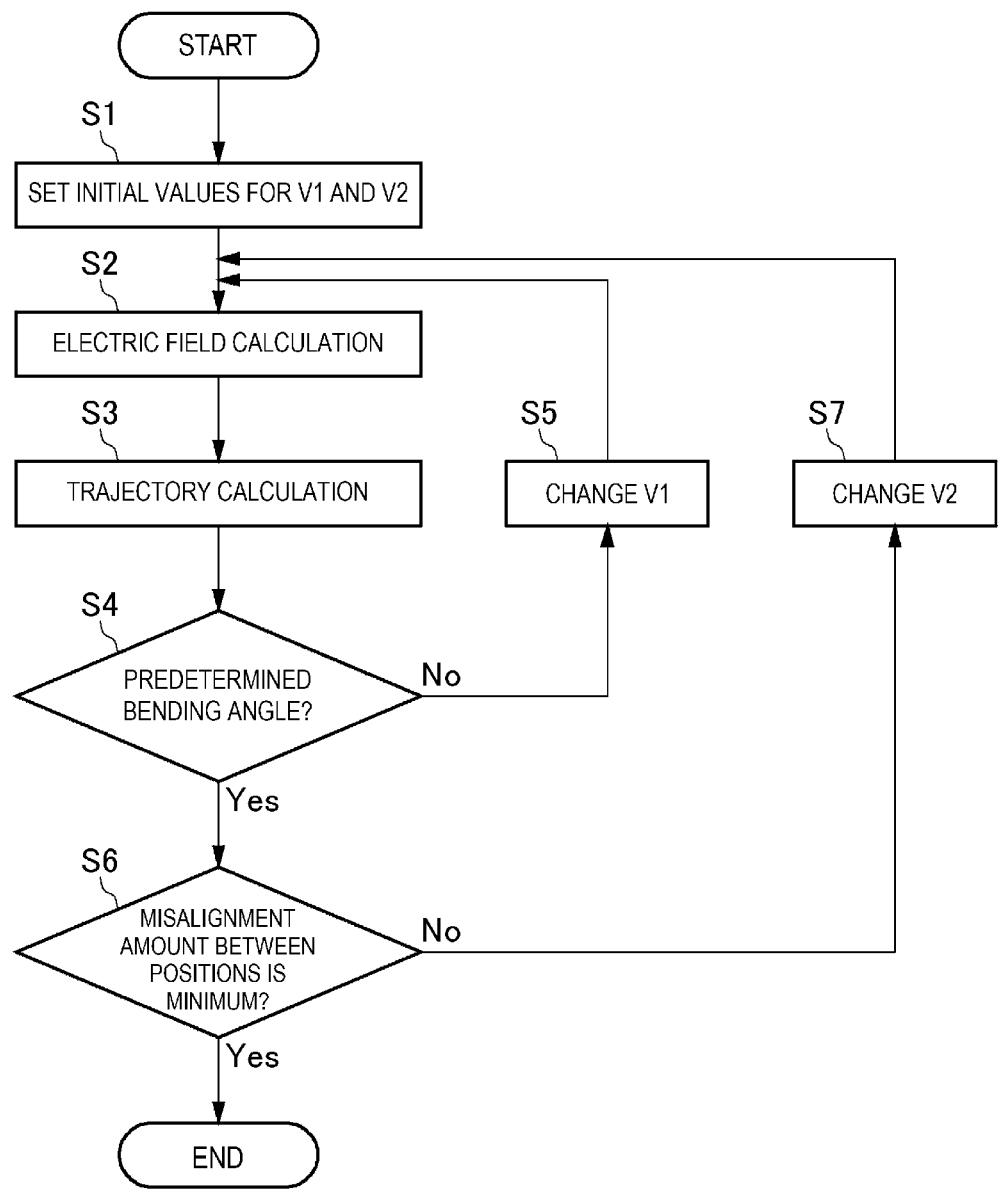
FIG. 5 is a flowchart illustrating the flow of the voltage adjustment of the beam bender of the embodiment of the present invention.

FIG. 5 is a flowchart illustrating the flow when the voltage to be applied to the inner electrode and the outer electrode of the beam bender 12 is determined by the numerical simulation. The voltage adjustment of the beam bender 12 is performed by the voltage control unit 16. In this case, a voltage V1+V2 is applied to the inner electrode and a voltage −V1+V2 is applied to the outer electrode.

As illustrated in FIG. 5, when the voltage adjustment of the beam bender 12 is performed, initial values of V1 and V2 are set first (S1), and the electric field calculation (S2) and the trajectory calculation (S3) are performed by the numerical simulation. Then, it is determined whether the bending angle of the electron ray (secondary electron) is a predetermined angle (for example, 30 degrees) (S4). When the bending angle is not the predetermined angle (NO in S4), the voltage V1 is adjusted (S5).

When the bending angle of the electron ray (secondary electron) becomes a predetermined angle (for example, 30 degrees) (Yes in S4) by adjusting the voltage V1, the misalignment between the positions at which the parallelly entering electron rays separated from the central trajectory O of the electron ray (secondary electron) by the predetermined distance r intersect with the central trajectory after passing between the inner curved surface 17 and the outer curved surface 19 is measured.

In this case, the misalignment between the positions at which the parallelly entering electron rays separated by the predetermined distance r in the phases of −90 degrees, −67.5 degrees, −45 degrees, −22.5 degrees, 0 degrees, 22.5 degrees, 45 degrees, 67.5 degrees, and 90 degrees with respect to the central trajectory O of the electron ray intersect with the central trajectory after passing between the inner curved surface 17 and the outer curved surface 19 is measured.

Further, it is determined whether the measured misalignment amount between the positions is minimum (S6). When the misalignment amount between the positions is not minimum (NO in S6), the voltage V2 is adjusted (S7). When the misalignment amount between the positions becomes minimum as a result of adjusting the voltage V2, the processing of the voltage adjustment is ended. Note that a well-known method such as a bivariate Newton-Raphson method can be used in the set of processes.

The voltage condition required here is generally referred to as a bidirectional convergence condition. The misalignment amount between the intersecting positions with respect to the central trajectory is minimum but is not 0. The misalignment amount between the intersecting positions under the bidirectional convergence condition is a unique value obtained from mechanical configurations of individual beam benders, and it can be said that the beam bender has a better convergence property as the value is closer to 0.

Figure 6:
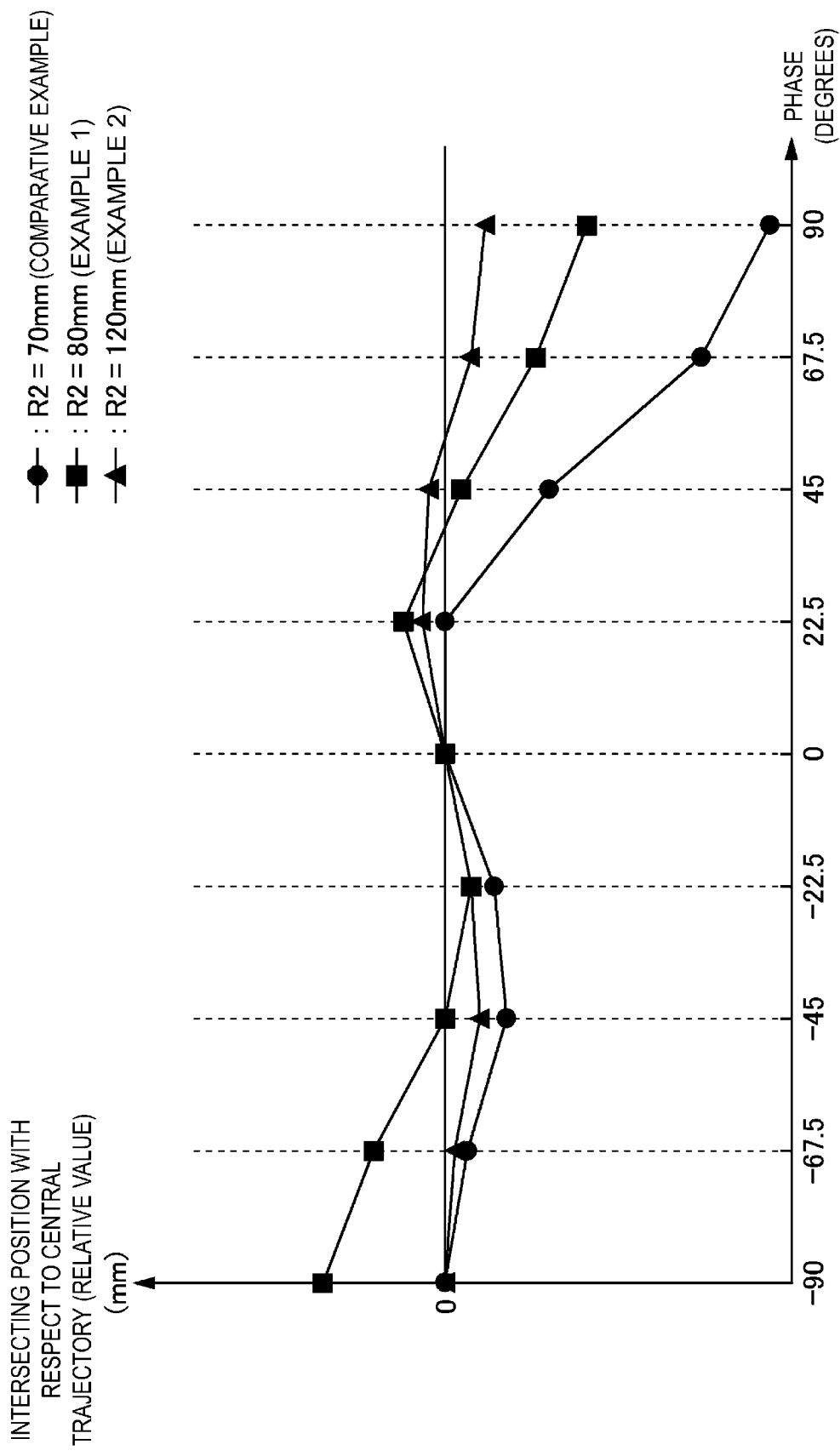
FIG. 6 is a graph showing the convergence property of the beam bender of the embodiment of the present invention.

In FIG. 6, the positions at which the parallelly entering electron rays that are separated by the predetermined distance r in the phases of −90 degrees, −67.5 degrees, −45 degrees, −22.5 degrees, 0 degrees, 22.5 degrees, 45 degrees, 67.5 degrees, and 90 degrees with respect to the central trajectory O of the electron ray intersect with the central trajectory after passing between the inner curved surface 17 and the outer curved surface 19 to which the electrical potentials of the bidirectional convergence condition are applied are indicated as relative values with respect to the intersecting position in the phase of 0 degrees for a comparative example in which the radius of curvature of the central trajectory of the electron ray in the second cross section is R2=70 mm, Example 1 in which R2=80 mm, and Example 2 in which R2=120 mm From the graph in FIG. 6, it can be understood that the misalignment amount between the intersecting positions is smaller in Example 1 than in the comparative example and is further smaller in Example 2 than in Example 1. The radius of curvature R2 of the central trajectory of the electron ray in the second cross section of the beam bender of which misalignment amount between the intersecting positions is small is determined as above.

According to the beam bender 12 of this embodiment, the convergence property of the electron ray bent by the beam bender 12 can be improved. More specifically, the misalignment between the positions at which the parallelly entering electron rays separated from the central trajectory of the electron ray that passes between the inner curved surface 17 and the outer curved surface 19 by a predetermined distance intersect with the central trajectory after passing between the inner curved surface 17 and the outer curved surface 19 can be reduced.

Note that, in the description above, only the feature in which the misalignment between the positions at which the parallelly entering electron rays separated from the central trajectory of the electron ray that passes between the inner curved surface 17 and the outer curved surface 19 by a predetermined distance intersect with the central trajectory after passing between the inner curved surface 17 and the outer curved surface 19 is reduced has been discussed, but the curvatures of the inner curved surface 17 and the outer curved surface 19 that minimize the misalignment between the positions that intersect with the central trajectory can be also determined with use of a similar method for a case where the entering electron rays are not parallel or a case where the separated distance is minutely different in accordance with the phase if properties thereof are understood in advance.

In addition, in this embodiment, the inner curved surface 17 and the outer curved surface 19 have a symmetrical shape, and hence the symmetry of the electron ray bent by the beam bender 12 can be improved. In addition, the convergence property of the electron ray bent by the beam bender 12 can be improved by setting the radius of curvature of the inner curved surface 17 and the radius of curvature of the outer curved surface 19 in the second cross section, as appropriate.

The embodiment of the present invention has been described above by exemplification, but the scope of the present invention is not limited thereto, and can be changed and modified in accordance with the object within the scope of the claims.

The beam bender of the present invention can also be used as a spectrometer that only takes out electrons having a predetermined energy from an electron ray in which various energies are mixed. When the beam bender of the present invention is used as a spectrometer, the convergence property of the electron ray is high in the beam bender of the present invention as described above, and hence the rate of electron rays having other energies being mixed after the spectral diffraction can be reduced, and the spectral characteristic (energy resolution) is improved.

As described above, the beam bender according to the present invention has an effect in which the convergence property of the electron ray bent by the beam bender can be improved, is used in the electron microscope and the like, and is useful.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A beam bender, comprising:
an inner electrode having an inner curved surface;
an outer electrode having an outer curved surface; and
a controller configured to apply different electrical potentials to each of the inner electrode and the outer electrode to generate an electric field which bends an electron ray that passes between the inner curved surface and the outer curved surface,
wherein a curvature of the inner curved surface and a curvature of the outer curved surface are set to be fixed, and a center of curvature of the inner curved surface and a center of curvature of the outer curved surface are set to match each other in a first cross section along a direction of travel of the electron ray that passes between the inner curved surface and the outer curved surface,
the curvature of the inner curved surface and the curvature of the outer curved surface are set to be fixed, and the center of curvature of the inner curved surface and the center of curvature of the outer curved surface are set to match each other in a second cross section perpendicular to the direction of travel of the electron ray,
a radius of the curvature of the inner curved surface of the inner electrode in the second cross section is set to be larger than a radius of the curvature of the inner curved surface of the inner electrode in the first cross section,
a radius of the curvature of the outer curved surface of the outer electrode in the second cross section is set to be larger than a radius of the curvature of the outer curved surface of the outer electrode in the first cross section, and wherein the controller is further configured to:
measure a misalignment distance defined by a distance between a first intersect point of a first electron ray entering a place between the inner curved surface and the outer curved surface with a central trajectory of an electron ray in the first cross section and a second intersect point of a second electron ray entering a place between the inner curved surface and the outer curved surface with the central trajectory;
adjust a voltage applied to the inner electrode and the outer electrode when the misalignment distance between the first intersect point and the second intersect point is above a minimum value to reduce the misalignment distance.

2. The beam bender according to claim 1, wherein, in the second cross section, a normal line of the inner curved surface passing through a center position of the inner curved surface and a normal line of the outer curved surface passing through a center position of the outer curved surface match each other, a position through which the electron ray passes is set on the normal lines, a curved surface shape of the inner curved surface has a symmetrical shape about the normal lines, and a curved surface shape of the outer curved surface has a symmetrical shape about the normal lines.

3. The beam bender according to claim 1, wherein the first electron ray and the second electron ray parallelly enter the place between the inner curved surface and the outer curved surface, and are separated from the central trajectory by a predetermined distance.

4. The beam bender according to claim 1, wherein:
the radius of the curvature of the inner curved surface in the second cross section is set to be more than one time of the radius of curvature of the inner curved surface in the first cross section and three times or less of the radius of curvature of the inner curved surface in the first cross section; and
the radius of the curvature of the outer curved surface in the second cross section is set to be more than one time of the radius of curvature of the outer curved surface in the first cross section and three times or less of the radius of curvature of the outer curved surface in the first cross section.

* * * * *